(12) United States Patent
Louzir et al.

(10) Patent No.: US 10,003,863 B2
(45) Date of Patent: *Jun. 19, 2018

(54) ELECTRICAL ACTIVITY SENSOR DEVICE FOR DETECTING ELECTRICAL ACTIVITY AND ELECTRICAL ACTIVITY MONITORING APPARATUS

(71) Applicant: THOMSON LICENSING, Issy les Moulineaux (FR)

(72) Inventors: Ali Louzir, Rennes (FR); Jean-Yves Le Naour, Pace (FR); Jean-Luc Robert, Betton (FR)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/786,948

(22) PCT Filed: Apr. 16, 2014

(86) PCT No.: PCT/EP2014/057829
§ 371 (c)(1),
(2) Date: Oct. 23, 2015

(87) PCT Pub. No.: WO2014/173783
PCT Pub. Date: Oct. 30, 2014

(65) Prior Publication Data
US 2016/0105735 A1    Apr. 14, 2016

(30) Foreign Application Priority Data
Apr. 23, 2013 (EP) .................................. 13305535

(51) Int. Cl.
*G08B 21/00* (2006.01)
*G06K 7/10* (2006.01)
(Continued)

(52) U.S. Cl.
CPC ................ *H04Q 9/00* (2013.01); *G01D 4/00* (2013.01); *G01R 21/133* (2013.01);
(Continued)

(58) Field of Classification Search
CPC .................................................... G01R 21/133
See application file for complete search history.

(56) References Cited

U.S. PATENT DOCUMENTS 4,686,772 A * 8/1987 Sobel ..................... G01C 17/38
33/333
8,149,119 B2   4/2012 Hanft
(Continued)

FOREIGN PATENT DOCUMENTS

CN   101128968    2/2008
CN   101322036    12/2008
(Continued)

OTHER PUBLICATIONS

Patel et al;"PI-Tags-Detecting-Batteryless-Tags-through-the Power-Lines-in-a-Building"; Jan. 2009; pp. 255-273.
(Continued)

*Primary Examiner* — Steven Lim
*Assistant Examiner* — Willard Edwards, Jr.
(74) *Attorney, Agent, or Firm* — Brian J. Dorini; Joseph J. Opalach (57) ABSTRACT

An electrical activity monitoring device based on an RFID sensor device attachable to a power cable of an electrical device for monitoring the electrical status of the electrical device. The device comprises an antenna element which performs the dual functions of magnetically coupling with an electrical pulse generated in the power cable in response to a change of electrical power state of the electrical device and to wirelessly transmit data to an RFID reader. An electrical activity monitoring apparatus is also provided for (Continued)

monitoring the electrical status of at least one electrical device connected to a power supply network by a respective power cable provided with an RFID sensor device. The electrical activity monitoring apparatus comprises an RFID reader for communicating with the RFID sensor device.

12 Claims, 8 Drawing Sheets

(51) Int. Cl.
    *H04Q 9/00*     (2006.01)
    *G01D 4/00*     (2006.01)
    *G01R 21/133*     (2006.01)

(52) U.S. Cl.
    CPC ..... *G06K 7/10366* (2013.01); *H04Q 2209/47* (2013.01); *H04Q 2209/60* (2013.01); *Y02B 90/248* (2013.01); *Y04S 20/38* (2013.01); *Y04S 20/52* (2013.01)

(56) References Cited

U.S. PATENT DOCUMENTS

| | | | |
|---|---|---|---|
| 2005/0184856 A1 | 8/2005 | Pourchot | |
| 2006/0264732 A1* | 11/2006 | Wu | A61B 5/06 600/407 |
| 2007/0115127 A1* | 5/2007 | Harper | G06Q 10/00 340/572.1 |
| 2007/0155349 A1 | 7/2007 | Nelson et al. | |
| 2007/0282944 A1 | 12/2007 | Odaka et al. | |
| 2008/0165518 A1 | 7/2008 | Ichiryu et al. | |
| 2010/0238003 A1 | 9/2010 | Chan et al. | |
| 2012/0262179 A1* | 10/2012 | Whan | G01V 11/00 324/345 |
| 2012/0280828 A1* | 11/2012 | Kim | H04Q 9/00 340/870.02 |
| 2013/0040570 A1* | 2/2013 | Wilkinson | G06K 7/10178 455/41.1 |
| 2015/0130480 A1* | 5/2015 | Berkcan | H04Q 9/00 324/633 |
| 2015/0254482 A1* | 9/2015 | Louzir | G01R 21/133 324/258 |
| 2016/0105735 A1* | 4/2016 | Louzir | G01D 4/00 340/870.02 |

FOREIGN PATENT DOCUMENTS

| | | |
|---|---|---|
| CN | 101739592 | 6/2010 |
| CN | 101776754 | 7/2010 |
| CN | 201892954 | 7/2011 |
| CN | 102216792 | 10/2011 |
| CN | 102496814 | 6/2012 |
| EP | 2418801 | 2/2012 |
| JP | 2007156779 | 6/2007 |
| JP | 2006098268 | 8/2008 |
| KR | 100891201 | 3/2009 |
| WO | WO2006120285 | 11/2006 |
| WO | WO2007063181 | 6/2007 |
| WO | WO2007135233 | 11/2007 |
| WO | WO2010031012 | 3/2010 |

OTHER PUBLICATIONS

CLEODE: "ZigBee-Power-Plug-ZPLUG-User-Manual"—Revision 3.0—Sep. 3, 2009; pp. 1-14.
NETVOX: "Intelligent-Home-Automation-System-based-on-ZigBee-Wireless-Sensor-Network-Technology"; Product Catalogue ; 2011; pp. 1-74.
Lucero Etal: "ABI-Research-Report—Home Automation and Monitoring;Home Control, Energy Management, Media Management, and Home Healthcare"—Apr. 29, 2011; pp. 1-58.
Search Report dated Jul. 23, 2014.

* cited by examiner

ELECTRICAL ACTIVITY SENSOR DEVICE FOR DETECTING ELECTRICAL ACTIVITY AND ELECTRICAL ACTIVITY MONITORING APPARATUS

TECHNICAL FIELD

The present invention relates to an electrical activity sensor device for detecting the electrical activity of an electrical device connected to a power supply network, in particular the change in electrical power state. The invention further relates to an electrical activity monitoring apparatus for monitoring the electrical activity of one or more electrical devices. The electrical activity sensor device is based on a radio frequency identification device (RFID).

BACKGROUND

The monitoring of electrical activity of electrical devices finds many useful applications in areas such as energy consumption, the building of user activity profiles, and in security or safety monitoring systems. For example, in a home environment, knowledge of the activity of electrical devices such as a washing machine, lighting devices, a cooker, a toaster or a coffee machine may provide useful information on household habits and user activity, enabling a profile to be built up.

A known solution for monitoring the activity of electrical devices employs a complex electrical meter system based on remote controlled modules plugged into power outlets and configured to measure the electrical consumption of the electrical equipment powered from the respective power outlet. Such, remote controlled modules are typically equipped with a wireless communication system based on low power wireless technology to remotely monitor and control the corresponding electrical appliance. Such advanced meter systems require however complex and expensive customized installation. Indeed, a recent research report on home automation and monitoring has indicated price and technical complexity as being the main market hurdles and inhibitors against widespread adoption. Another drawback of such techniques is that electrical devices may be moved from one power outlet to another power outlet. Moreover, some devices such as lighting devices are not always powered from a power outlet.

Other solutions for the detection of the activity of electrical devices are based on sensing their "EMI (electromagnetic interference) signature" by monitoring powerlines at one or several points of the power supply network. These techniques require however a customised calibration and training process to learn the EMI signature of various devices. Moreover, the EMI signatures may evolve with time. Complex signal processing techniques are required to disaggregate the signatures of the various active devices connected to the network and the obtained results are not always very accurate.

The present invention has been devised with the foregoing in mind.

SUMMARY

In a general form the invention concerns an electrical activity sensor device based on a radio frequency identification device (RFID).

According to a first aspect of the invention there is provided an electrical activity sensor device for monitoring the electrical status of an electrical device, the device comprising an RFID sensor device attachable to a power cable of the electrical device, the RFID sensor device including: an antenna element operable to magnetically couple with an electrical pulse generated in the power cable to generate an electrical signal in response to a change in the electrical power state of the electrical device; and a memory element for storing, in response to the generated electrical signal, data representative of the power state change of the electrical device; wherein the antenna element is further operable to wirelessly transmit data representative of the electrical power state change of the electrical device and identification data identifying the RFID sensor device to an RFID reader device.

Detection of electrical activity can thus be provided in a simplified and low cost manner. The RFID sensor has a dual function of electrical activity detection and transmission of electrical activity data. Data may for example be transmitted to a remote RFID reader in response to interrogation by the RFID reader via the power supply network.

A change in the electrical power state of a device may include the switching ON of the device, the switching OFF of the device, the switching from a standby mode to an ON power state, and the switching from an ON power state to a standby mode.

In an embodiment the antenna element performs both magnetic coupling to the electrical pulse and wireless transmission within the same operating frequency range. This provides a simplified detection device since it is not necessary to provide further signal processing for data transmission.

In an embodiment the antenna element comprises a loop antenna. For example the antenna element may be formed as a loop antenna or the antenna element may be an antenna assembly with an integrated loop antenna.

In an embodiment the antenna element is configured to be arranged around at least part of the power cable to form an induction coil. Such a configuration provides more efficient magnetic coupling.

In an embodiment, the device includes a pulse detector configured to distinguish between electrical signals induced from switching between different electrical power states. For example the pulse detector may be configured to distinguish between an electrical signal induced from switching ON the electrical device and an electrical signal induced from switching OFF the electrical device. Moreover, the pulse detector may be configured to distinguish an electrical signal induced from switching from a standby mode to an ON state from an electrical signal induced from switching from an ON state to a standby state. In some particular embodiments the pulse detector may be configured to distinguish between electrical signals induced from switching between an OFF state and an ON state from those induced switching between a standby mode and an ON state. In this way information as to the electrical power state is provided.

In an embodiment the RFID sensor device is operable as a passive RFID tag powered by electromagnetic induction via the power cord. This enables power consumption to be reduced by avoiding the use of battery powered RFID tags.

In an embodiment the device includes electrical consumption measurement means for providing data representative of the power consumption of the electrical device when the electrical device is switched on and wherein the data transmitted by the antenna element includes the data representative of the power consumption of the electrical device.

In an embodiment the device includes a timer for measuring the duration of time from the time of the detected change in the electrical power state of the electrical device.

The data representative of the power state change of the electrical device may comprise identification data identifying the RFID tag. For example the identification data may be enough to indicate an electrical power state change. In other embodiments the data representative of the power state change may be transmitted in addition to the RFID tag identification data.

According to a second aspect of the invention there is provided an electrical activity monitoring apparatus for monitoring the electrical status of at least one electrical device connected to a power supply network by a respective power cable provided with an RFID sensor device, the electrical activity monitoring apparatus comprising: an RFID reader module for reading data representative of a change in electrical status of one or more RFID sensor devices, each RFID sensor device being attached to a respective power cable of an electrical device wherein the data representative of a change in electrical status is received wirelessly from the respective RFID sensor device and a monitor device for determining from the data received by the RFID reader module, which electrical devices of the power supply network have changed electrical status.

In an embodiment, the RFID reader module is configured to trigger transmission of one or more interrogation signals to the RFID sensors to request the data representative of a change in electrical status.

In an embodiment, the RFID reader module is configured to trigger the transmission of one or more interrogation signals in response to a detected change in power consumption measured by an electricity meter connected to the power supply network.

In an embodiment, a communication network interface is provided for connecting with a communication network to enable transmission of data to or reception of data from a remote server connected to the communication network.

In an embodiment, the RFID reader module is configured to trigger the transmission of one or more interrogation signals in response to a command signal received via the communication network.

In an embodiment the electrical activity monitoring apparatus is included in a gateway device providing an interface between an external data communication network and an internal data communication network A further aspect of the invention provides a gateway device providing an interface between an external data communication network and an internal data communication network comprising an apparatus according to any embodiment of the second aspect of the invention.

According to a further aspect of the invention there is provided an electrical activity monitoring system comprising at least one electrical activity sensor device according to any embodiment of the first aspect of the invention for monitoring the electrical status of an electrical device, and an electrical activity monitoring apparatus according to any embodiment of the second aspect of the invention.

In an embodiment the electrical activity monitoring system further includes an electricity meter connected to the electrical activity monitoring apparatus for monitoring electrical power consumption in the power supply network.

According to a further aspect of the invention there is provided an RFID sensor device for monitoring the electrical status of an electrical device, the RFID sensor device being attachable to a power cable of the electrical device, and comprising an antenna element operable to magnetically couple with an electrical pulse generated in the power cable to generate an electrical signal in response to a change in the electrical power state of the electrical device; and a memory element for storing, in response to the generated electrical signal, data representative of the power state change of the electrical device; wherein the antenna element is further operable to transmit data representative of the electrical power state change of the electrical device wirelessly to an RFID reader device.

A further aspect of the invention provides an RFID system for detection of the activity of home electrical appliances of an home equipment comprising an electricity meter for measuring the power consumption of the home electrical appliances, RFID sensing tags taped to the power supply cord of each home electrical appliance, means for detecting a change of the home electrical appliances power consumption delivered by the electricity meter; a radio frequency identification (RFID) tag reader, triggered by the detecting means if a change is detected, reading data from the RFID sensing tags, the data comprising identification code and the state (on or off) of each appliance means for identifying a change of state of at least one appliance in analyzing the data read by the triggered RFID tag reader, and means for delivering information concerning the change of state of the at least one identified appliance.

In an embodiment, the change of the home electrical appliances power consumption delivered by the home electricity meter is due to state change of at least one electrical home appliance.

In an embodiment, each RFID sensing tag comprises an antenna operating in the UHF band.

In an embodiment, the RFID system is embedded in a Home Gateway.

In an embodiment, each passive RFID sensing tag includes a passive sensor which allows the detection of the impulse current flowing through the power supply cord when the state of the electrical home appliance is changing.

A further aspect of the invention relates to an RFID system for detection of the electrical activity of electrical devices connected to a power supply network comprising at least one RFID sensing tag attached to the power supply cord of a respective electrical device, means for detecting a change in power consumption delivered by an electricity meter connected to the power supply network; a radio frequency identification (RFID) tag reader, triggered by the detecting means in the case where a change is detected to read data from said at least one RFID sensing tag, the data comprising identification code and the state (on or off) of the respective electrical device; means for identifying a change of state of at least one electrical device in analyzing the data read by the triggered RFID tag reader, Some processes implemented by elements of the invention may be computer implemented. Accordingly, such elements may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, such elements may take the form of a computer program product embodied in any tangible medium of expression having computer usable program code embodied in the medium.

Since elements of the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which.

DETAILED DESCRIPTION

Figure 1:
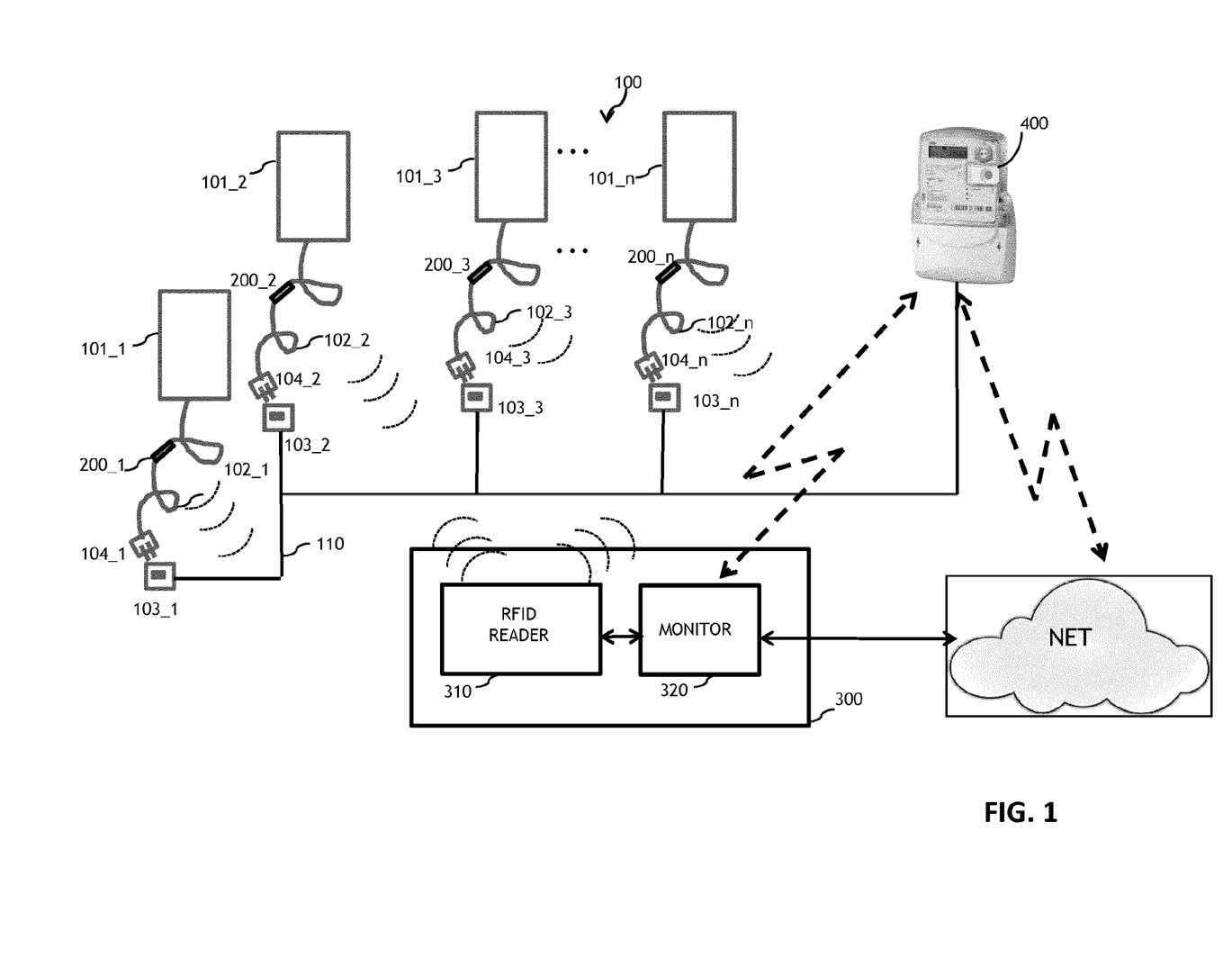
FIG. 1 is a schematic block diagram of an electrical activity monitoring system in which one or more embodiments of the invention may be implemented

FIG. 1 is a schematic block diagram of an electrical activity monitoring system in which one or more embodiments of the invention may be implemented. The electrical activity monitoring system 100 monitors the change in electrical status of n electrical devices 101_1 to 101_n. Each electrical device 101_1 to 101_n is connected by means of a respective electrical power cable 102_1 to 102_n to a power outlet 103_1 to 103_n of an electrical power supply network 110. It will be appreciated that while in the illustrated embodiment of FIG. 1 each electrical device 101_1 to 101_n is connected to a respective power outlet 103_1 to 103_n, in other embodiments of the invention a plurality of electrical devices may be connected to the same power outlet 103_x. Each electrical power cable 102_1 to 102_n is provided with a respective RFID sensor unit 200_1 to 200_n. The electrical activity monitoring system 100 further includes an electrical activity monitoring apparatus 300 connected to the power supply network 110. The power supply network 110 is provided with a smart electricity meter 400 for measuring electrical consumption in the power supply network 110. The electrical activity monitoring apparatus 300 may be connected to a communication network NET such as an Internet network so that data on the electrical activity of the system may be transmitted to a remote server device, such as for example the server of an electricity power supplier company.

Figure 2A:
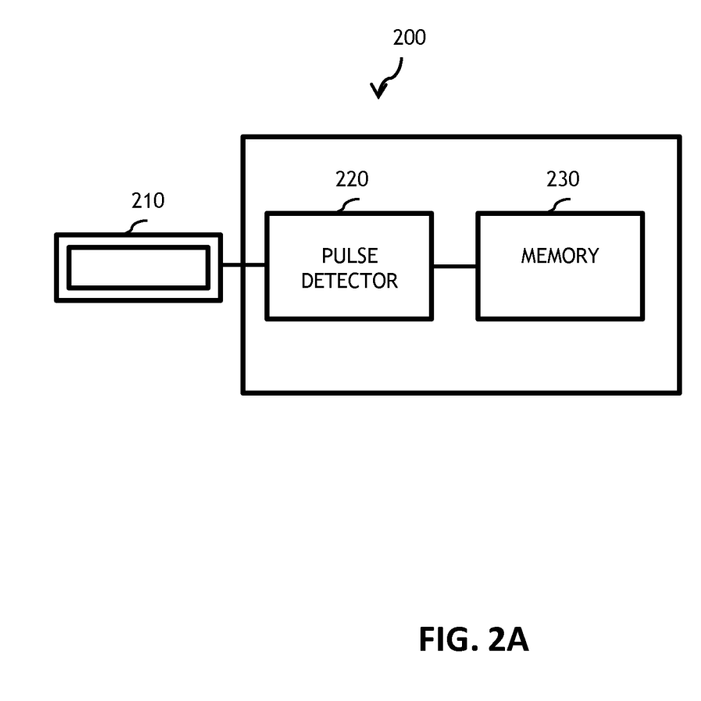
FIG. 2A is a schematic block diagram of an RFID sensor device in accordance with an embodiment of the invention.

FIG. 2A is a schematic block diagram of an RFID sensor device 200 in accordance with an embodiment of the invention.

The RFID sensor device 200 comprises an antenna 210, a pulse detection module 220 and a memory chip 230 for storing data representative of an electrical status change. The data representative of the power state change of the electrical device may comprise identification data identifying the RFID tag. For example the identification data may be enough to indicate an electrical power state change. In other embodiments the data representative of the power state change may be transmitted in addition to the RFID tag identification data.

An RFID sensor device may also be referred to as an RFID tag, an RFID label, an RFID transponder and the like.

The antenna 210 has a dual function. Firstly, the antenna 210 of an RFID sensor unit 200_x is used to detect the electrical pulse generated in the respective power cable 102_x when the corresponding electrical device 101_x undergoes a change in electrical power state, for example is switched ON or switched OFF. Indeed, the generated electrical pulse results from the change in power state of the respective electrical device 101_x. When an electrical device 101_x is switched ON or OFF, a current pulse flows in its respective power cable 102_x. The antenna 210 of the respective RFID sensor device 200_x attached to the power cable 102_x couples magnetically to the current pulse generating an electrical pulse which can be detected by the pulse detection module 220.

The second function of the antenna 210 is to transmit data from the memory chip 230 wirelessly to an RFID reader of the monitoring device 300. Indeed the operating frequency range of the antenna 210 enables the performance of both functions of impulse detection by magnetic coupling and wireless transmission of data to the RFID reader.

For example the RFID sensor device 200 in this embodiment is a far field/long range RFID tag operating in the UHF frequency band, for example in the range from 800 MHz to 960 MHz, for instance in the region of 860 MHz or 900 MHz, or in the region of 433 MHz or in the HF frequency band, for example in the region of 13.6 MHz.

RFID is considered as a non specific short range device. It can use frequency bands without a license. Nevertheless, RFID should typically be compliant with local regulations (ETSI, FCC etc.)

LF: 125 kHz-134.2 kHz: low frequencies,
HF: 13.56 MHz: high frequencies,
UHF: 860 MHz-960 MHz: ultra high frequencies,
SHF: 2.45 GHz: super high frequencies Transmission of the data from the RFID sensor device 200 may be performed in response to an interrogation from the RFID reader.

The memory chip 230 stores data indicating the change in electrical status of the corresponding electrical device 101_x. In some embodiments of the invention, the electrical voltage induced in the antenna 210 by the electrical pulse in the power cable 102_x and detected by pulse detector 220 may be used to activate the memory chip 230 to enable data to be stored. In the case of a passive type RFID tag the antenna 210 acts as a power-coupling inductor which can harvest electrical power from the current pulse in the power cable to operate the modules of the RFID sensor device 200. Since the RFID sensor device 200 in this particular embodiment is a passive RFID sensor device, energy consumption can be minimized since power is not being supplied constantly to the RFID sensor device 200 from a power supply such as a battery. It will be appreciated, however, that in alternative embodiments of the invention the RFID sensor device 200 may be an active type RFID tag powered by its own power supply means or a battery assisted passive type RFID tag.

Each RFID sensor device 200 in the electrical monitoring system 100 is provided with an identification code enabling the monitoring device 300 to identify it.

The RFID sensor device 200 may be attached to the respective power cable 102_x by any form of fixation means such as for example by adhesive such as glue, sticking tape, or a sticker, by a mechanical connection such as for example staples, screws, nails; or by being embedded in the insulating sheath cover of the respective power cable 102_x.

Figure 2B:
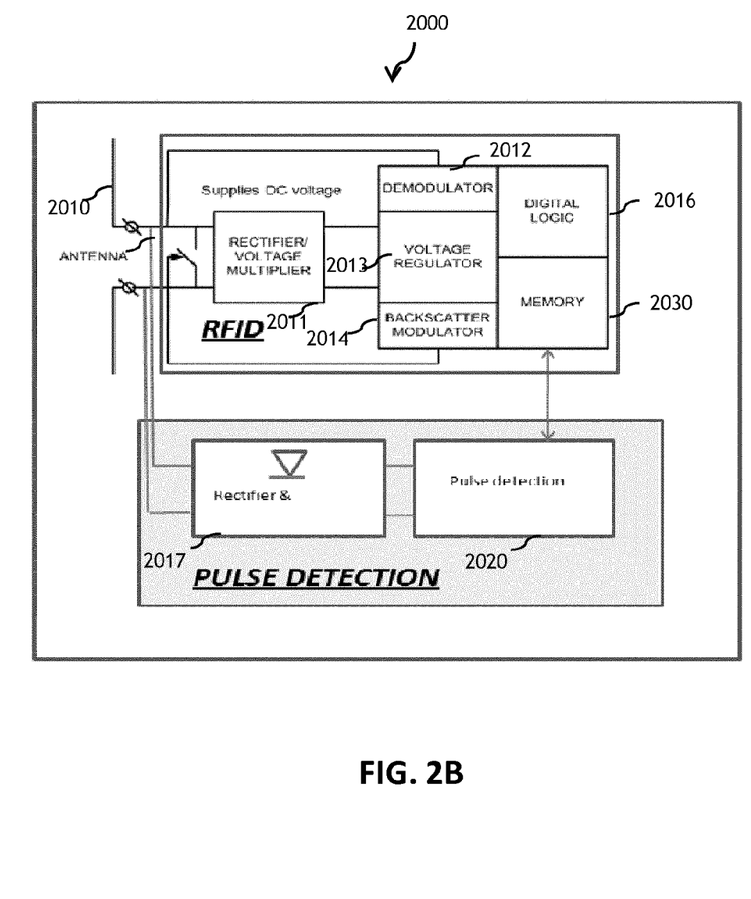
FIG. 2B is a schematic block diagram of an RFID sensor device in accordance with an embodiment of the invention.

FIG. 2B is a schematic block diagram of an RFID sensor device 2000 in accordance with a particular embodiment of the invention. The RFID sensor device 2000 comprises a UHF antenna 2010; a RFID circuit including a rectifier 2011 for providing a DC voltage to power modules of the RFID sensor device 2000, a demodulator 2012, a voltage regulator 2013, a backscatter modulator 2014, memory 2030 and a digital logic circuit 2016, and a pulse detection circuit including a rectifier 2017 and a pulse detector 2020. The pulse detection circuit is configured for detecting the pulse induced in the antenna loop 2010 by the electrical pulse in the power supply cable and to deliver an information to the RFID memory 2030 by changing the value of one bit memory, so called "state bit", (from 0 to 1 and vice versa) of the RFID chipset. The RFID sensor may be a standard passive UHF standard compliant RFID tag to which an impulse sensor circuit is connected.

Figure 3A:
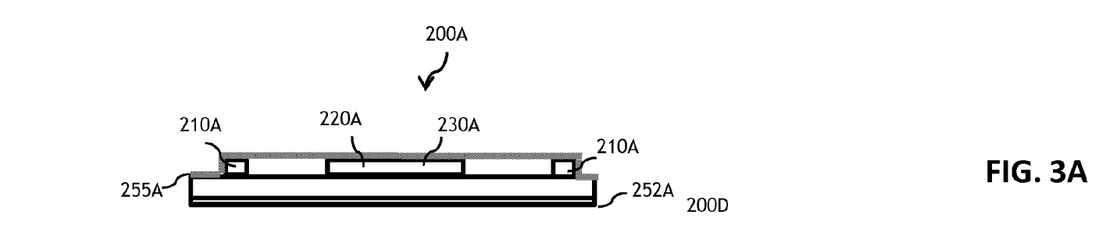
FIG. 3A to 3C are schematic diagrams of an RFID sensor device in accordance with different embodiments of the invention.

In one particular embodiment, as illustrated in FIG. 3A, the RFID sensor device 200A is provided in the form of a sticker with adhesive material 252A provided on the underside of the sticker to attach the sticker to the respective power cable 102_x while the antenna 210A, the pulse detection module 220A and memory chip 230A are provided on the topside of the sticker and covered by a protective cover layer 255A.

In some embodiments of the invention the antenna 210 may be shaped to fit around at least part of the power cable 102_x. In some embodiments of the invention, the antenna 210 of the RFID sensor device 200 is in the form of a loop antenna and in use is arranged around at least part of the respective power cable 102_x.

Figures 3B, 3C, 3D:
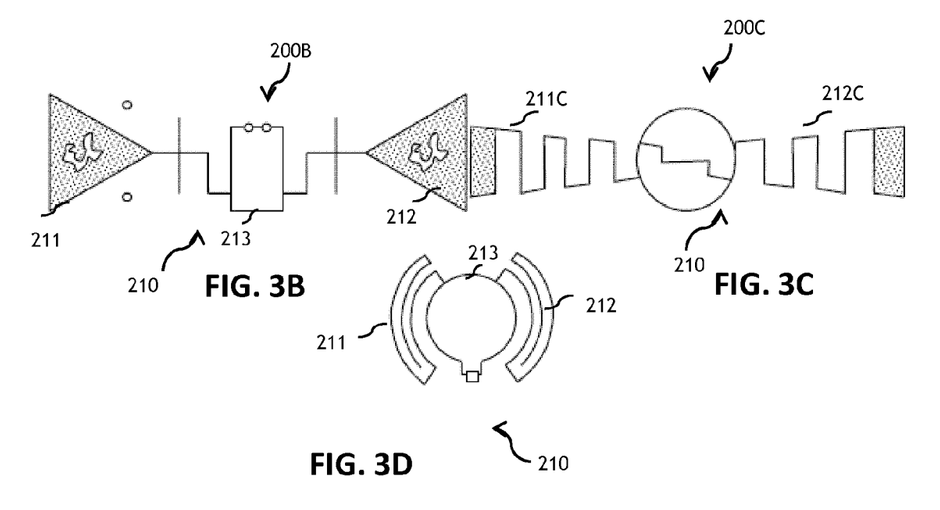
FIG. 3D is a schematic diagram of an antenna assembly in accordance with an embodiment of the invention.

FIGS. 3B and 3D schematically illustrate an example of an RFID sensor 200B in accordance with an embodiment of the invention. The RFID sensor 200B is provided with an antenna assembly 210 comprising UHF antenna elements 211 and 212 for transmitting data to the RFID reader with a loop element 213 to ensure magnetic coupling with the current flow in the power cable, for detection of the electrical impulse in the electrical cable, and the RFID circuit comprising the pulse detector 220 and the RFID memory 230. The shape of the antenna assembly is configured based on the form factor of the power cable.

FIG. 3C schematically illustrates another example of an RFID sensor in accordance with another embodiment of the invention. The RFID sensor 200C is provided with an antenna assembly 210 comprising UHF antenna elements 211C and 212C for transmitting data to the RFID reader with a loop element 213C to ensure magnetic coupling with the current flow in the power cable, for detection of the electrical impulse in the electrical cable, and the RFID circuit comprising the pulse detector 220 and the RFID memory 230. The antenna assembly operates in the same way as the antenna assembly of FIG. 3B but with different shapes of UHF antenna elements and loop element.

Figure 4:
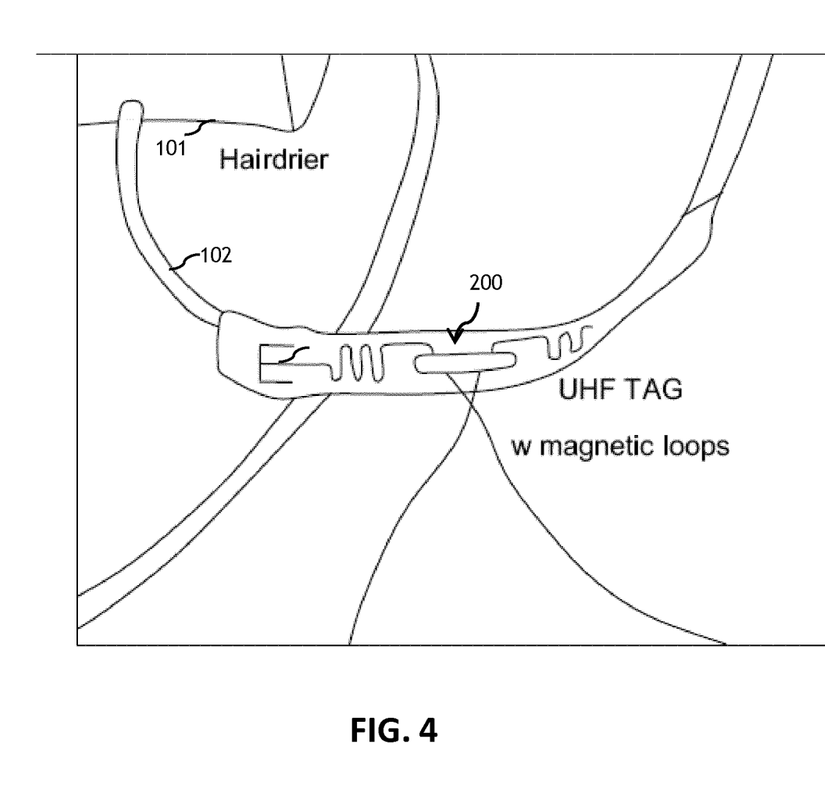
FIG. 4 is a schematic diagram illustrating an RFID sensor device in accordance with an embodiment of the invention attached to the power cable of an electrical device.

FIG. 4 schematically illustrates the arrangement of an RFID sensor device 200 attached to the power cable 102 of an electrical appliance 101, in this example a hair dryer. The RFID sensor 200 is provided on a flexible substrate provided with adhesive wrapped circumferentially around part of the power cable 102.

Figure 5A:
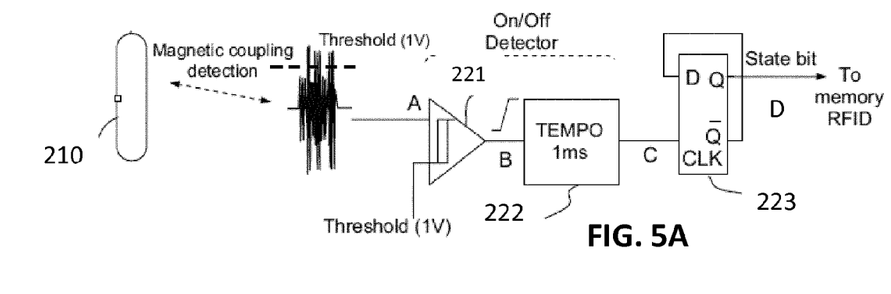
FIG. 5A is a block functional diagram of elements of a RFID sensor device in accordance with an embodiment of the invention.
Figure 5B:
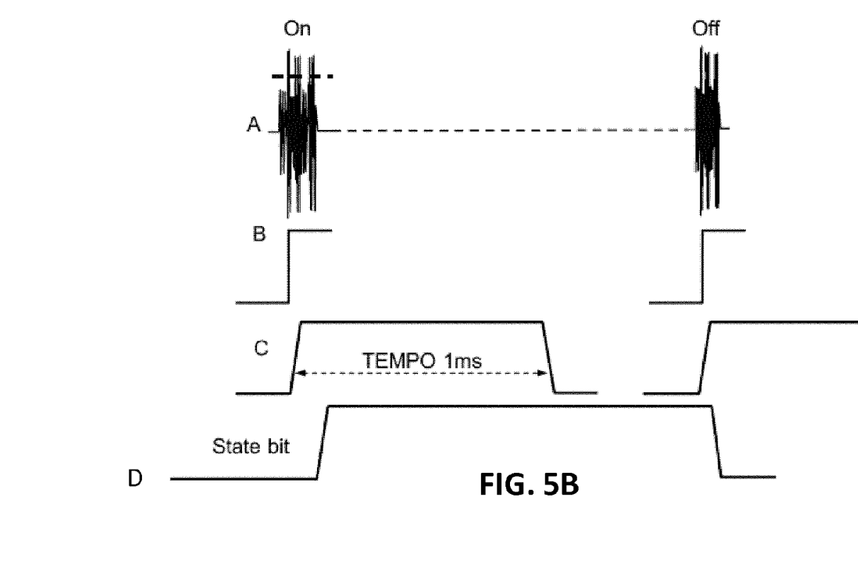
FIG. 5B is a graphical diagram illustrating a signal processing process implemented by an RFID sensor in accordance with an embodiment of the invention.

FIG. 5A is a schematic diagram illustrating an example of operation of the pulse detection module 220 of the RFID sensor device 200 in which the antenna 210 has the form of a loop antenna. A power state change pulse signal A is picked up by the loop antenna 210, by means of a magnetic coupling effect. When the amplitude of the power state change pulse signal A exceeds a predetermined threshold (1V for example), a block comparator 221 detects an input pulse signal and in response changes the state of the output signal B. In order to avoid multi triggering, a temporization device 222 may be connected to the output of the comparator 221 to provide a signal C at its output which corresponds to the signal issued from the comparator during a set temporization time. A D flip flop module 223 generates a state bit D. The state bit D is changed for each clocked impulse since the D Flip Flop module 223 is clocked by the output signal C of the temporization module 222. Consequently the last bit of bit signal D changes state at each detected pulse (at switch on or off). The state can thus be used to indicate an electrical power state change. The bit value is stored in the memory chip 230 of the RFID sensor device 200. This information representative of a change of electrical power state of respective electrical device 101_x can then be transmitted with the identification code ID RFID sensor device 200 to the monitoring device 300. Signals A, B, C and D of the operation of FIG. 5A are graphically represented in FIG. 5B.

In particular embodiments of the invention by knowing the initial electrical power state of the electrical device 101_x at counter reset, it is possible to determine from the state of bit signal D whether the electrical change corresponds to an ON/OFF electrical status change or an OFF/ON electrical status change. Moreover, by knowing the ON or OFF power state of the electrical device at the previous reading the ON or OFF power state at the subsequent reading can be deduced.

Figure 6:
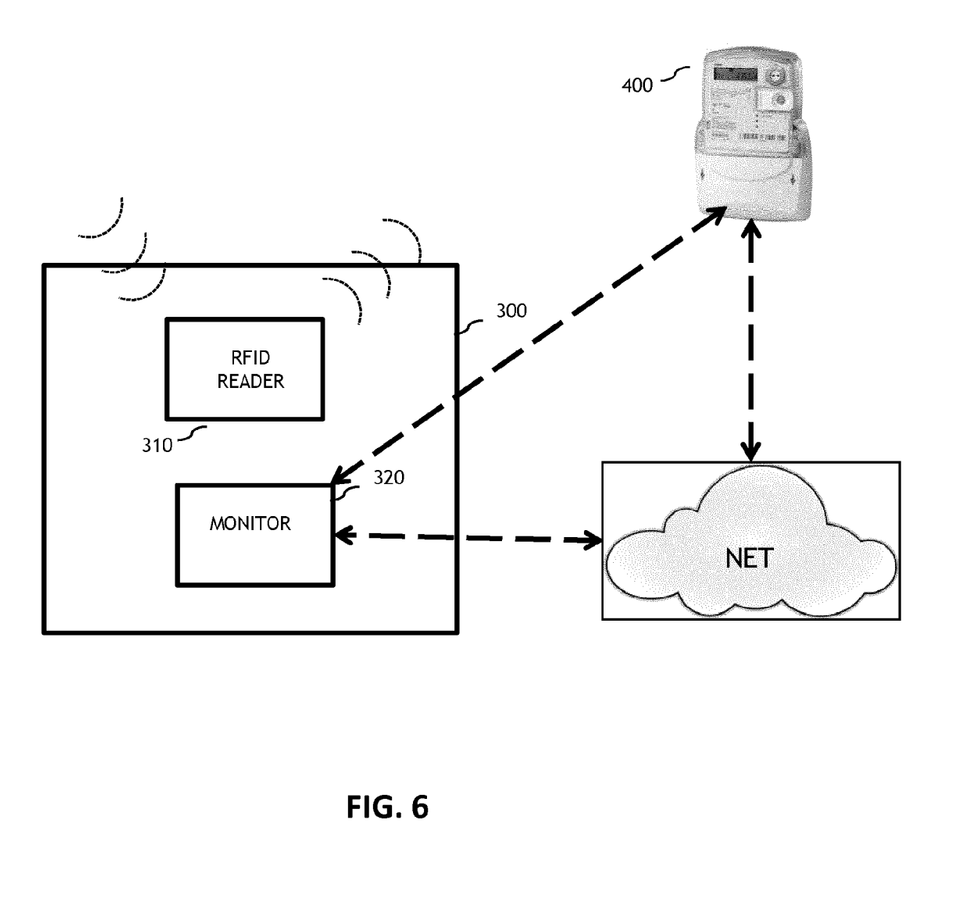
FIG. 6 is a schematic block diagram of an electrical activity monitoring apparatus in accordance with an embodiment of the invention.

FIG. 6 is a block diagram schematically illustrating an electrical activity monitoring apparatus 300 in accordance with an embodiment of the invention. The electrical activity monitoring apparatus 300 comprises an RFID reader device 310 and a monitoring device 320 for processing RFID data signals.

The RFID reader device 310 is a far field RFID type reader and is configured to wirelessly receive RFID data signals transmitted from the electrical activity sensors attached to the power cables 102 of the network via wireless transmission from the respective dipole type antenna 250 and to send RFID interrogation signals to the RFID sensors 200 via wireless transmission to the respective dipole type antennas 250.

Monitoring device 320 receives data from the RFID reader device 310 indicative of the electrical activity status of the electrical devices 101_1 to 101_n in the electrical activity monitoring system 100.

In one particular embodiment of the invention the monitoring device 330 is connected to a smart type electricity meter 400 connected to the power supply network 110 of the system. The electricity meter 400 and the monitoring 330 device may be connected by a wireless or wired connection. The smart electricity meter 400 is configured to monitor the power consumption of electrical devices 101_1 to 101_n connected to the power network 110. The smart electricity meter 400 is configured to detect a change in power consumption: for example an increase in the rate of power consumption which may result from the switching ON of one or more electrical devices 101_1 to 101_n supplied by the power network 110, or a decrease in the rate of power consumption which may result from the switching OFF of one or more of the electrical devices 101_1 to 101_n supplied by the power network 110. In response to the detected change in power consumption a command signal is transmitted from the monitoring device 330 to the RFID reader device 310 to activate an RFID reading process. The RFID reader device 310 in response to the command signal transmits an interrogation signal to the RFID sensor devices 200_1 to 200_n in order to read the electrical status data stored in the respective RFID memory chips 230_1 to 230_n of the RFID sensor devices 200_1 to 200_n. The interrogation signals are then backscattered by the RFID sensor devices 200_1 to 200_n towards the monitoring apparatus 300. The back scattered signals from the RFID sensor devices 200_1 to 200_n each include the identification code of the respective electrical devices 102_1 to 102_n and the corresponding electrical power state change information stored in the respective RFID memory chip 230. The collected electrical power state change information signals are received at the interface device 320 and transformed to be read by RFID processing module 312 of RFID reader device 310. The processed electrical power state change activity information is then transmitted to the monitoring device 330.

Monitoring device 330 may further process the received power state change information or transfer the power state change information to another device, such as a remote device connected via a communication network.

For example, if an electrical device 101_x, for example a coffee machine, connected to a household power supply network 110 is switched ON (for example from an OFF power state or from a STANDBY mode):

1. The total power consumption will increase by an amount corresponding to the power consumed by the coffee machine. This change in power consumption will be measured by smart electricity meter 400.

2. The current impulse generated in the corresponding power cable in response to the switch on activates the corresponding RFID sensor device 200 attached to the respective power cable, and the status information change (OFF to ON) is stored in the RFID memory chip by switching a bit (the "state bit") from 0 (corresponding to OFF state) to 1 (corresponding to ON state)

The increase in power consumption measured by the smart electricity meter 400 may be detected by the monitoring device 330. In response to the detected increase a read command is sent to the RFID reader device 300 to trigger a read phase of the RFID reader device 310. The RFID reader module 310 reads all the RFID sensor devices 200_1 to 200_n of the electrical devices 101_1 to 101_n connected to the power network 110 by transmitting interrogation signals. The read information of each RFID sensor 200_1 and includes its identification and its electrical ON/OFF change status.

In some embodiments of the invention by comparing the electrical change status of all the RFID sensor devices read with the previous one stored in an electrical devices status dataset, at the previous reading phase, it is possible to infer which electrical device has been powered on and the electrical devices status dataset may be updated accordingly.

In other embodiments of the invention, the state of the respective state bit signal stored on the corresponding RFID memory chip can be used to identify which electrical device or devices have been switched on or off.

In some particular embodiments of the invention for an electrical device an electrical pulse generated by an ON to OFF or STANDBY electrical power state change, may be distinguished from an electrical pulse generated by an OFF or STANDBY to ON electrical power state change by characterizing the pulse signals. The impulse detector 220 of the RIFD sensor device 200 of such embodiments is configured to detect from the characteristics of the generated electrical pulse signal whether the electrical pulse results from an ON to OFF or STANDBY power state change or from an OFF or STANDBY to ON power state change.

In further embodiments the impulse detector may be configured to distinguish between an OFF to ON and a STANDBY to ON; and to distinguish between an ON to STANDBY and an ON to OFF, by characterizing the resulting pulse signals.

In another embodiment of the invention the power consumed by an electrical device 101_x may be determined, for example by detecting an OFF to ON power state change or a standby to ON power state change and then determining the duration of time for which the electrical device is placed in an ON state. Data representative of the power consumption may then be transferred wirelessly from the corresponding RFID sensor device 200_x to the RFID reader device 300 in the same way as data representative of the electrical power state change is transmitted to the RFID reader device 300.

The electrical power state change data or consumption data may be processed to provide relevant information on electrical activity of the power network 110, such as for example to build a household user profile, to detect and warn of increased electrical power consumption, and/or to provide recommendations for reducing energy consumption In other embodiments of the invention, rather than sending an interrogation signal from the RFID reader to the RFID sensor devices in response to a command from the monitoring device 330 the RFID reader may send interrogation signals automatically to the RFID sensor devices without being commanded by the monitoring device; for example on a periodic basis.

In some embodiments of the system that monitoring device may be part of a home gateway system connected to an external internet network. Real time tracking of the total home power consumption could be provided by the home electricity provider via the internet network. For example the electricity provider could trigger reading phases of the RFID reader by transmitting signals from a remote server via the gateway device.

Figure 7:
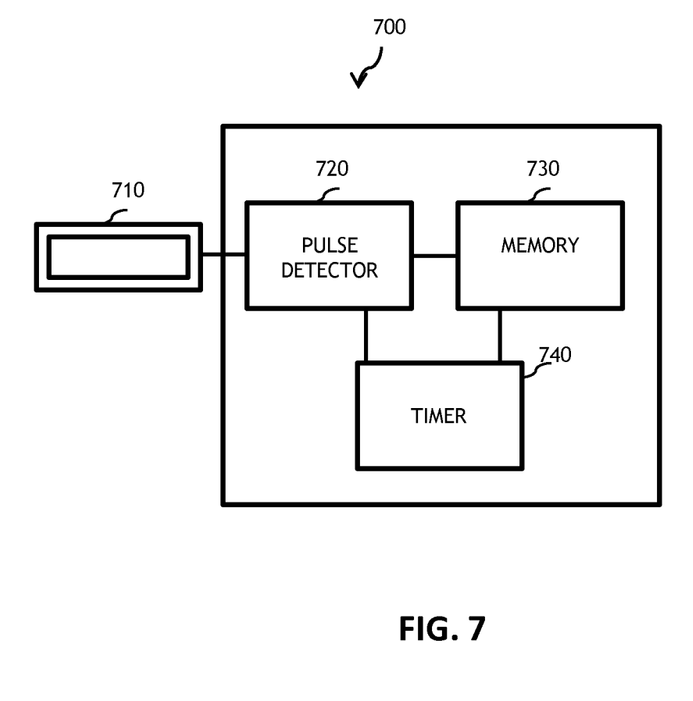
FIG. 7 is a schematic block diagram of an RFID sensor device in accordance with a further embodiment of the invention.

FIG. 7 is a schematic functional block diagram of an RFID sensor device 700 in accordance with a further embodiment of the invention.

The RFID sensor device 700 comprises an antenna 710, a pulse detection module 720 and a memory chip 730 for storing identification data of the RFID sensor and data representative of an electrical status change. These elements operate in a similar way to corresponding elements of the embodiment of FIG. 2. With respect to the embodiment of FIG. 2 the RFID sensor device 700 further includes a timer 740. The timer 740 is used to measure the duration of time for which the electrical device has been changed electrical state by measuring the amount of time from when a pulse was detected by the pulse detector 720. The time data may be stored in memory 730 and transmitted with the ID data and electrical status data to the RFID reader. The timing data enables the amount of time a device has been switched on or off to be determined.

Although the present invention has been described hereinabove with reference to specific embodiments, the present invention is not limited to the specific embodiments, and modifications will be apparent to a skilled person in the art which lie within the scope of the present invention.

For instance, while the foregoing examples have been described with respect to a household power network system, it will be appreciated that embodiments of the invention may be applied to any power network to which electrical devices are connected. Moreover the system could be applied in security or safety applications to identify electrical devices which have been changed electrical power state, such as being switched on or switched off.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

The invention claimed is:

1. An electrical activity sensor device for monitoring an electrical status of an electrical device, the electrical activity sensor device comprising:
   a far field radio frequency identification tag attachable to a power cable of the electrical device, the radio frequency identification sensor device including:
      an antenna element operable to magnetically couple with an electrical pulse generated in the power cable to induce an electrical signal in response to a change in electrical power state of the electrical device; and
      a memory element for storing, in response to the induced electrical signal, data representative of the power state change of the electrical device;
      wherein the antenna element is further operable to transmit data representative of the power state change of the electrical device and identification data identifying the radio frequency identification sensor device wirelessly to a radio frequency identification reader device,
   wherein the far field radio frequency identification tag performs both magnetic coupling to the electrical pulse and data transmission within its operating frequency range.

2. A device according to claim 1, wherein the antenna element comprises a loop antenna.

3. A device according to claim 1 wherein the antenna element is configured to be arranged around at least part of the power supply cable to form an induction coil.

4. A device according to claim 1 comprising a pulse detector configured to distinguish an electrical signal induced from switching on the electrical device from an electrical signal induced from switching off the electrical device.

5. A device according to claim 1 wherein the radio frequency identification sensor device is operable as a passive radio frequency identification tag powered by electromagnetic induction via the power cable.

6. A device according to claim 1 further comprising electrical consumption measurement means for providing data representative of the power consumption of the electrical device when the electrical device is switched on and wherein the data transmitted by the antenna element includes the data representative of the power consumption of the electrical device.

7. A device according to claim 1 further comprising a timer to measure the duration of time since the detected change in the electrical power state of the electrical device.

8. An electrical activity monitoring system for monitoring an electrical status of at least one electrical device connected to a power supply network by a respective power cable provided with a radio frequency identification sensor device, the electrical activity monitoring apparatus comprising:
   at least one far field radio frequency identification tag attachable to a power cable of the electrical device, operable to magnetically couple with an electrical pulse generated in the power cable to induce an electrical signal in response to a change in electrical power state of the electrical device; and including
      a memory element for storing, in response to the induced electrical signal, data representative of the power state change of the electrical device;
   wherein the far field radio frequency identification tag is further operable to transmit data representative of the power state change of the electrical device and identification data identifying the radio frequency identification sensor device wirelessly to a radio frequency identification reader device
      a radio frequency identification reader module for reading electrical status data representative of a change in electrical power state of the at least one far field radio frequency identification tag.

9. A system according to claim 8, wherein the radio frequency identification reader module is configured to trigger the transmission of one or more interrogation signals in response to a detected change in power consumption measured by an electricity meter connected to the power supply network.

10. A system according to claim 8 comprising a communication network interface for connecting with a communication network to enable transmission of data to or reception of data from a remote server connected to the communication network.

11. A system according to claim 8 wherein the radio frequency identification reader module is configured to trigger the transmission of one or more interrogation signals in response to a command signal received via the communication network.

12. A system according to claim 8 comprising a gateway system providing an interface between an external data communication network and an internal data communication network.

* * * * *